United States Patent
Chi et al.

[11] Patent Number: 5,976,945
[45] Date of Patent: Nov. 2, 1999

[54] METHOD FOR FABRICATING A DRAM CELL STRUCTURE ON AN SOI WAFER INCORPORATING A TWO DIMENSIONAL TRENCH CAPACITOR

[75] Inventors: Min-Hwa Chi; Chih-Yuan Lu, both of Hsinchu, Taiwan

[73] Assignee: Vanguard International Semiconductor Corporation, Hsin-Chu, Taiwan

[21] Appl. No.: 08/974,452

[22] Filed: Nov. 20, 1997

[51] Int. Cl.$^6$ .................................................. H01L 21/20
[52] U.S. Cl. ......................... 438/386; 438/244; 438/386; 438/393
[58] Field of Search ..................... 438/386, 171, 438/190, 210, 238, 243, 244, 393, 397, 739, 701; 29/25.03; 216/6; 257/68, 71, 296, 309, 534; 361/313

[56] References Cited

U.S. PATENT DOCUMENTS

| | | | |
|---|---|---|---|
| 5,153,813 | 10/1992 | Oehrlein et al. | 361/313 |
| 5,176,789 | 1/1993 | Yamazaki et al. | 156/643 |
| 5,418,177 | 5/1995 | Choi | 437/52 |
| 5,432,365 | 7/1995 | Chin et al. | 257/301 |
| 5,449,630 | 9/1995 | Lur et al. | 438/386 |
| 5,585,285 | 12/1996 | Tang | 437/21 |
| 5,629,226 | 5/1997 | Ohtsuki | 438/389 |

OTHER PUBLICATIONS

Eimori, et al, "VLSI DRAM/SIMOX with Stacked Capacitor Cells Cells for Low Voltage Operation" IEDM-93, 1993, pp. 45–48.

Nishihara et al, "A Buried Capacitor Cell with Bonded SIO for 256–Mbit and 1–Gbit DRAMs" Solid State Technology, Jun. '94. pp. 89–94.

Primary Examiner—Charles Bowers
Assistant Examiner—Craig Thompson
Attorney, Agent, or Firm—George O. Saile; Stephen B. Ackerman

[57] ABSTRACT

A method for fabricating a DRAM cell, on a SOI layer, is described, featuring the incorporation of a two dimensional, trench capacitor structure, for increased DRAM cell signal, and the use of a polysilicon storage node structure to connect the SOI layer to the semiconductor substrate, to eliminate a floating body effect. A two dimensional trench is created by initially forming a vertical trench, through the SOI layer, through the underlying insulator layer, and into the semiconductor substrate. An isotropic etch is than performed to laterally remove a specific amount of insulator layer, exposed in the vertical trench, creating the lateral component of the two dimensional trench. A deposited polysilicon layer, coating the sides of the two dimensional trench, is used as the storage node structure, for the two dimensional, trench capacitor structure, while also connecting the SOI layer to the semiconductor substrate.

24 Claims, 4 Drawing Sheets

METHOD FOR FABRICATING A DRAM CELL STRUCTURE ON AN SOI WAFER INCORPORATING A TWO DIMENSIONAL TRENCH CAPACITOR

BACKGROUND OF THE INVENTION

(1) Field of the Invention

The present invention relates to a method of fabricating a dynamic random access memory, (DRAM), cell, on a semiconductor substrate.

(2) Description of Prior Art

The ability to continually increase the signal of DRAM devices, via capacitance increases, using a stacked capacitor configuration, is limited by the dimension of the underlying transfer gate transistor. The reduced dimensions of the underlying transfer gate transistor limit the amount of capacitor area available for an overlying stacked capacitor structure, thus motivating semiconductor device designers, and process engineers, to migrate to DRAM cells, incorporating trench capacitors. The ability to create the DRAM capacitor in a trench in the semiconductor substrate, has allowed DRAM devices densities of 64 Mbit and greater to be achieved.

This invention will offer a fabrication sequence used for the creation of high density DRAM designs, using a two dimensional trench capacitor structure. The use of a silicon on insulator, (SOI), layer, incorporated in this invention, allows an undercutting of the trench to occur, in the region in which the trench resides in the insulator layer, underlying the SOI layer, resulting in an increase in capacitor surface area, for a specific trench depth. In addition the storage node capacitor layer, residing on the sides of the trench, shorts the SOI layer to the semiconductor substrate, thus eliminating a floating body effect that can occur with DRAM structures, fabricated in on a SOI layer. Prior art such as Tang, U.S. Pat. No. 5,585,285, shows a trench through an SOI layer, but does not show the intentional undercut used in this invention, offering additional capacitor surface area. Ohtsuki, et al, in U.S. Pat. No. 5,629,226, describe a DRAM device, using a trench capacitor, with the bottom of the trench widened using diffusion procedures. However none of these prior arts describe a DRAM device, using the combination of a lateral undercut in a trench, and the elimination of the floating body effect resulting from the shorting of the SOI layer and the semiconductor substrate, via use of a storage node capacitor layer.

SUMMARY OF THE INVENTION

It is an object of this invention to fabricate a DRAM cell, on an SOI layer, incorporating a trench capacitor structure.

It is another object of this invention to use a two dimensional trench capacitor structure, comprised of a vertical trench component, through the SOI layer, through the insulator layer, and into the semiconductor substrate, and a lateral trench component, obtained via undercutting the insulator layer, between the SOI layer and the semiconductor substrate.

It is still another object of this invention to eliminate the floating body effect, encountered with devices fabricated on SOI layers, via the use of a polysilicon layer, on the sides of the trench, shorting the SOI layer to the semiconductor substrate.

In accordance with the present invention a method of fabricating a DRAM cell, on a SOI layer, using a two dimensional trench capacitor structure, and a polysilicon storage node layer, shorting the SOI layer to the semiconductor substrate, is described. A silicon layer overlying an insulator layer, on a semiconductor substrate, is provided. A thin pad silicon oxide layer is formed on the silicon on insulator, (SOI), layer, followed by the creation of a vertical trench, obtained via an anisotropic reactive ion etching, (RIE), procedure, in the pad silicon oxide layer, in the SOI layer, in the insulator layer underlying the SOI layer, and into a portion of the semiconductor substrate. An isotropic, wet etching procedure is employed to widen the trench, in the insulator layer, creating a lateral trench component, in the insulator layer, between the overlying SOI layer, and the underlying semiconductor substrate. A first polysilicon layer is next deposited, at a thickness which allows the first polysilicon layer to only interface the sides of the trench, without completely filling the trench, connecting the SOI layer to the semiconductor substrate. A deposition of a dielectric layer, overlying the first polysilicon layer is next accomplished, followed by the deposition of a second polysilicon layer, overlying the dielectric layer and completely filling the trench. An anisotropic RIE procedure is used to remove the second polysilicon layer, the dielectric layer, and the first polysilicon layer, from areas outside the trench, resulting in the trench capacitor structure comprised of a storage node, formed from the first polysilicon layer, a capacitor dielectric layer, and a cell plate, formed from the second polysilicon layer. Removal of the thin pad oxide layer is followed by the creation of the transfer gate transistor, comprised of a thin gate insulator layer, on the SOI layer, a polysilicon gate structure on the thin gate insulator layer, lightly doped source and drain regions, insulator spacers on the sides of the polysilicon gate structure, and heavily doped source and drain regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of creating a DRAM cell, on a SOI layer, incorporating a two dimensional trench capacitor structure, and a polysilicon storage node structure, used to connect the SOI layer to the semiconductor substrate, will now be described in detail.

Figure 1:
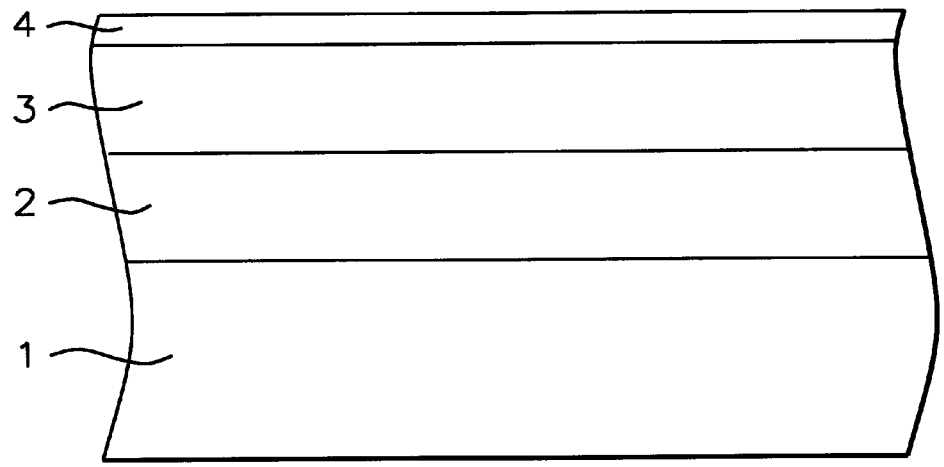
FIGS. 1–7, which schematically, in cross sectional style, show key stages of fabrication used to create a DRAM cell, on an SOI layer, incorporating a two dimensional trench capacitor structure.

FIG. 1, shows a starting, P type, semiconductor substrate 1, of single crystalline silicon, with a <100> crystallographic orientation. The method used to create silicon oxide layer 2, residing between underlying substrate 1, and overlying SOI layer 3, is the SIMOX process, (Separation by IMplanted OXygen). This process, featuring high energy, oxygen ion implantation into semiconductor substrate 1, followed by high temperature annealing, results in creation insulator 2, comprised of silicon oxide, to a thickness between about 1500 to 3000 Angstroms, underlying SOI layer 3. Overlying SOI layer 3, is comprised of P type silicon, with a <100> crystallographic orientation, at a thickness between about 1000 to 3000 Angstroms, and with a resistivity of about the same as the starting P type substrate 1, between about 10 to 50 ohm-cm. The defect density of SOI layer 3, similar to the defect density of an SOI wafer commercially available, is comparable to defect densities of prime bulk silicon wafers. A pad silicon oxide layer 4, is thermally grown on the SOI layer, to a thickness between about 100 to 300 Angstroms. The result of these processes is schematically shown in FIG. 1. Fabrication of isolation regions, using local oxidation of silicon, (LOCOS), is next performed, however not shown in the drawings.

Figure 2:
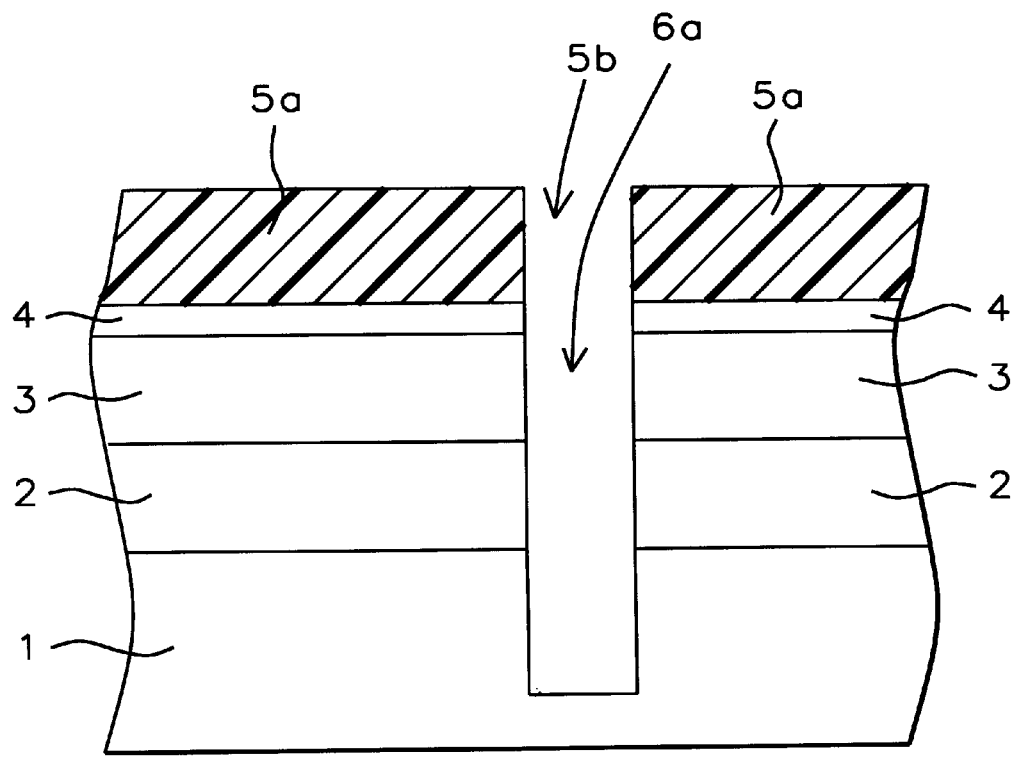
Figure 3:
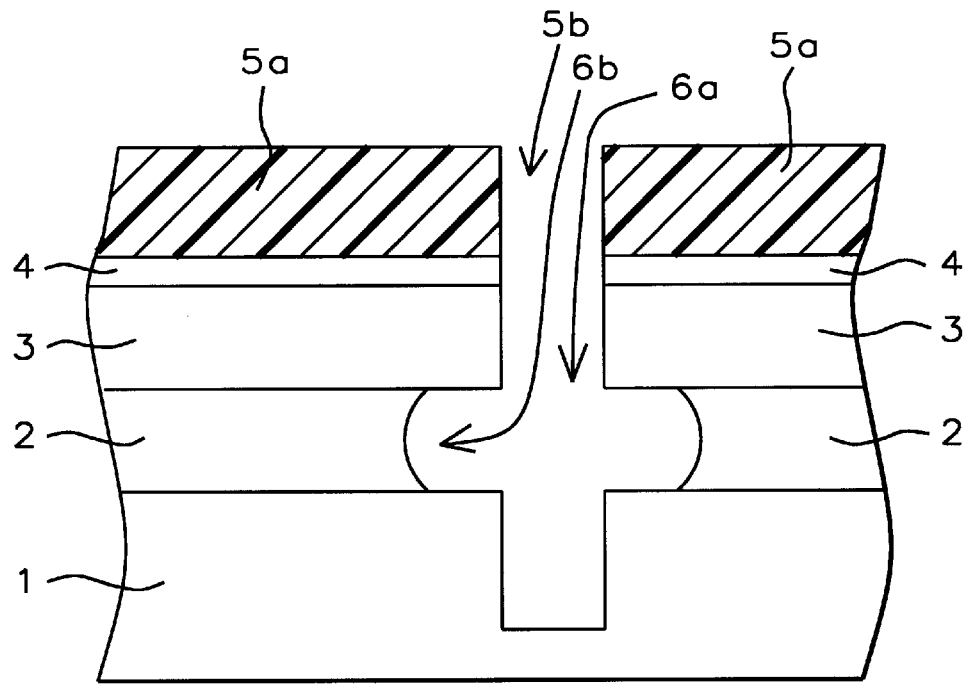

FIG. 2, schematically shows the creation of a vertical trench. A photoresist shape 5a, with an opening 5b, between about 0.30 to 0.60 $\mu$M, in diameter, is formed on pad silicon oxide layer 4. An anisotropic reactive ion etching, (RIE), procedure, using fluorine based etchants, for pad silicon oxide layer 4, using chlorine based etchants for SOI layer 3, using fluorine based etchants for silicon oxide layer 2, and again using chlorine based etchants for semiconductor substrate 1, is employed to create vertical trench 6a. Vertical trench 6a, with a diameter between about 0.30 to 0.60 $\mu$M, extends into semiconductor substrate 1, to a depth between about 1.0 to 5.0 $\mu$M. The exposed sides of silicon oxide layer 2, are next subjected to a buffered hydrofluoric acid solution, resulting in the undercutting of silicon oxide layer 2, and creating a lateral trench component 6b. The lateral trench component, schematically shown in FIG. 3, extends inward between about 0.20 to 1.0 Angstroms, between SOI layer 3, and semiconductor substrate 1. The creation of the two dimensional trench will result in an increase in capacitor surface area, compared to one dimensional trench counterparts.

Figure 4:
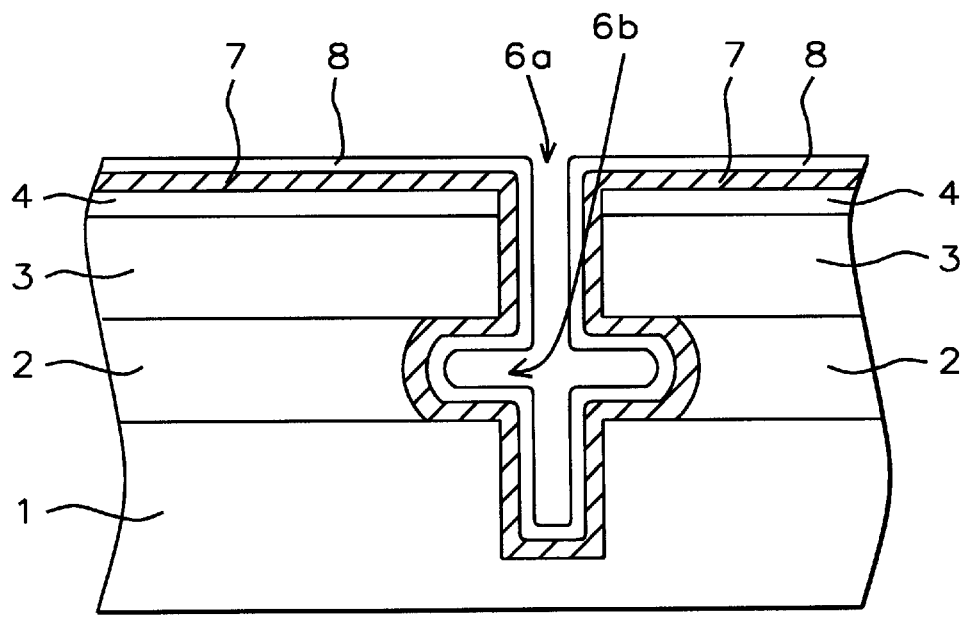

Photoresist shape 5a, is removed using plasma oxygen ashing, followed by careful wet cleans, including a buffered hydrofluoric acid procedure, used to remove native oxide from the sides of SOI layer 3, and the sides of semiconductor substrate 1, exposed in the two dimensional trench. A first polysilicon layer 7, is next deposited, via a low pressure chemical vapor deposition, (LPCVD), procedure, to a thickness between about 750 to 1000 Angstroms. First polysilicon layer 7, schematically shown in FIG. 4, is grown using a P type, in situ doping procedure, via the addition of diborane to a silane ambient, at a deposition temperature between about 570 to 630° C. First polysilicon layer 7, which subsequently will be patterned for use as the storage node structure, for the two dimensional trench capacitor structure, is continuous along the two dimensional trench, electrically connecting SOI layer 3, to semiconductor substrate 1. A dielectric layer 8, to be used as the capacitor dielectric layer, is next formed on the top surface of first polysilicon layer 7. This is schematically shown in FIG. 4. Dielectric layer 8, at a silicon oxide equivalent thickness between about 40 to 150 Angstroms, can be a $Ta_2O_5$ layer, or an ONO, (Oxidized silicon Nitride on silicon Oxide).

Figure 5:
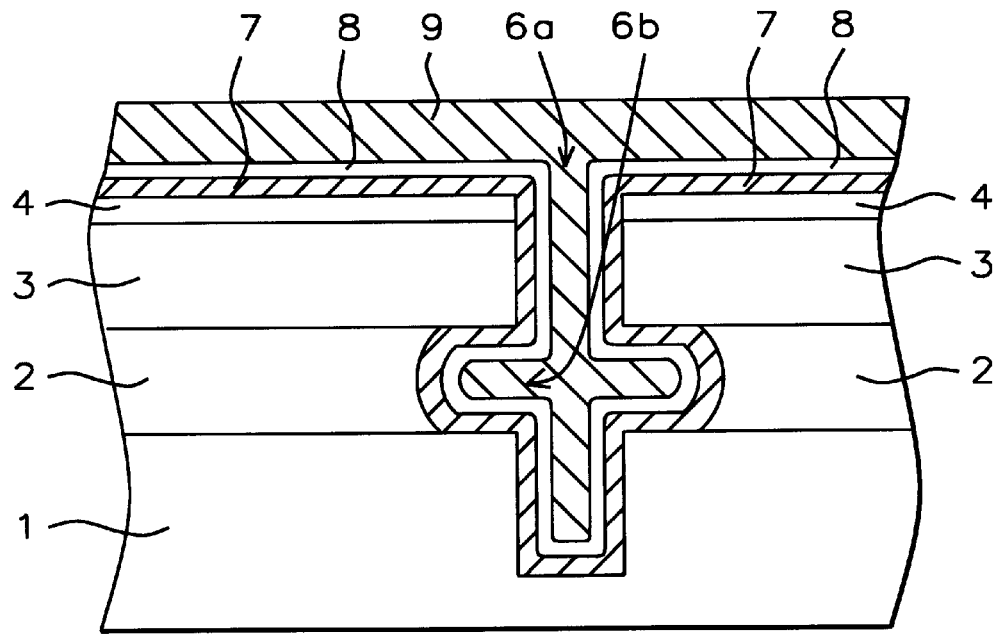
Figure 6:
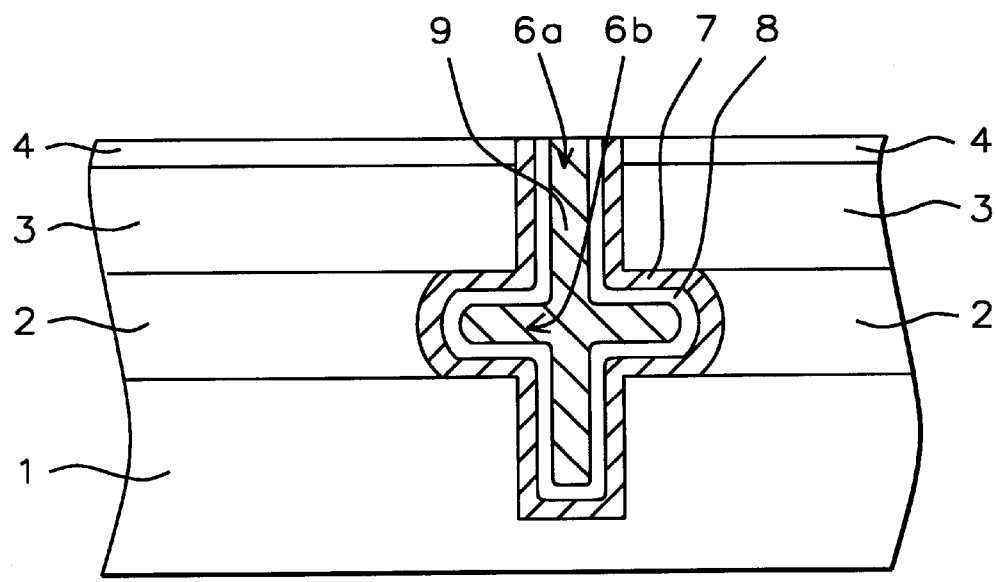

A second polysilicon layer 9, is next deposited, again using LPCVD procedures, at a temperature between about 570 to 630° C., to a thickness between about 1000 to 2500 Angstroms, completely filling the two dimensional trench. Second polysilicon layer 9, can be grown as an N type or P type layer, via in situ doping procedures, via the addition of either phosphine, or diborane, to a silane ambient. Second polysilicon layer 9, can also be deposited intrinsically, and doped via ion implantation procedures, using phosphorous or arsenic as N type sources, or boron as a P type source. This is shown schematically in FIG. 5. Etchback of second polysilicon layer 9, of dielectric layer 8, and of first polysilicon layer 7, is next addressed via anisotropic RIE, using chlorine based etchants for second polysilicon layer 9, and first polysilicon layer 7, while fluorine based etchants are used for dielectric layer 8. This is schematically shown in FIG. 6. Thus a capacitor structure, comprised of a storage node structure, formed from first polysilicon layer 7, a capacitor dielectric layer, formed from dielectric layer 8, and a cell plate, formed from second polysilicon layer 9, resides in the two dimensional trench, with increased capacitance resulting from the increased surface area achieved with the lateral trench component 6b. In addition a floating body effect, encountered in SOI type devices, is eliminated via the shorting of SOI layer 3, to semiconductor substrate 1, via the storage node structure, or first polysilicon layer 7.

Figure 7:
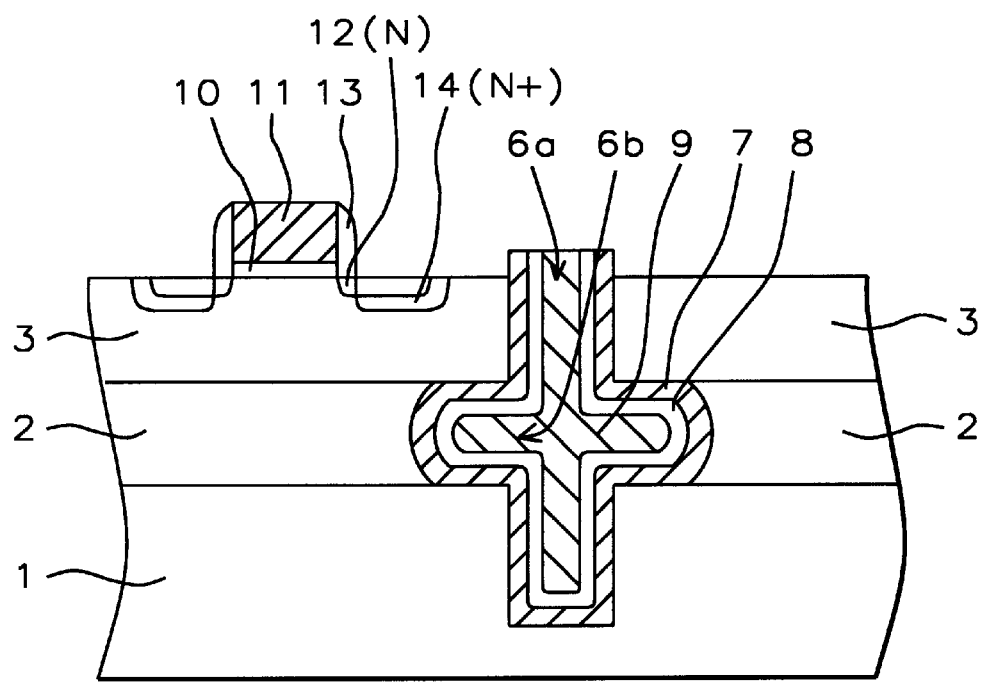

Finally the transfer gate transistor, of the DRAM cell, is addressed, and shown schematically in FIG. 7. After removal of pad silicon oxide layer 5, via use of a buffered hydrofluoric solution, or via the use of an anisotropic RIE procedure, using $CHF_3$ as an etchant, a gate insulator layer 10, of silicon dioxide, is thermally grown, to a thickness between about 60 to 120 Angstroms. A third polysilicon layer is deposited, via LPCVD procedures, to a thickness between about 1500 to 4000 Angstroms, and doped using either in situ doping procedures, by the addition of either phosphine or arsine, to a silane ambient, or the third polysilicon layer can be grown intrinsically and doped via ion implantation procedures, using arsenic or phosphorous ions. Conventional photolithographic and anisotropic RIE procedures, using chlorine based etchants, are used to form polysilicon gate structure 11, schematically shown in FIG. 7. Lightly doped source and drain region 12, is formed in semiconductor substrate 1, in regions in which semiconductor substrate is not covered by polysilicon gate structure 11. Lightly doped source and drain region 12, is formed via ion implantation of arsenic or phosphorous, at an energy between about 5 to 30 KeV, at a dose between about 1E13 to 1E14 atoms/$cm^2$. Insulator spacers 13, are next formed on the sides of polysilicon gate structure 11, via initially deposited a silicon oxide layer, via either LPCVD or plasma enhanced chemical vapor deposition, (PECVD), procedures, to a thickness between about 1000 to 3000 Angstroms, followed by an anisotropic RIE procedure, using fluorine based etchants. Finally heavily source and drain region 14, is formed via ion implantation of arsenic or phosphorous, at an energy between about 10 to 100 KeV, and at a dose between about 1E15 to 1E16 atoms/$cm^2$.

Although the transfer gate transistor is described as an N channel device, a P channel device can also be employed via the fabrication of an N well region, in SOI layer 3, and the creation of P type source and drain regions. For this case the first polysilicon layer in the two dimensional trench has to be N type, doped with phosphorous.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a DRAM cell on a SOI layer, on a semiconductor substrate, comprising the steps of:

forming an insulator layer in said semiconductor substrate, with a silicon on insulator layer, (SOI), overlying said insulator layer;

forming a pad silicon oxide layer on SOI layer;

forming a vertical trench in said pad silicon oxide layer, in said SOI layer, in said insulator layer, and in a top portion of said semiconductor substrate;

forming a lateral trench, in said insulator layer, exposed in said vertical trench;

depositing a first polysilicon layer, coating the exposed sides of said vertical trench, and the exposed sides of said lateral trench;

forming a dielectric layer on said first polysilicon layer;

depositing a second polysilicon layer on said dielectric layer, completely filling said vertical trench, and completely filling said lateral trench;

forming a capacitor structure, in said vertical trench, and in said lateral trench, comprised of: a storage node structure, formed from said first polysilicon layer; a capacitor dielectric layer, formed from said dielectric layer; and a cell plate structure, formed from said second polysilicon layer; with said storage node structure providing contact between said SOI layer and said semiconductor substrate; and forming a transfer gate transistor in said SOI layer.

2. The method of claim 1, wherein said insulator layer, in said semiconductor substrate, is silicon oxide, formed to a thickness between about 1500 to 3000 Angstroms, using a Separation by IMplanted OXygen, (SIMOX), process, via ion implantation of oxygen, followed by a high temperature annealing procedure.

3. The method of claim 1, wherein said SOI layer is a P type, single crystalline, silicon, with a <100> crystallographic orientation, at a thickness between about 1000 to 3000 with a resistivity between about 10 to 50 ohm-cm.

4. The method of claim 1, wherein said vertical trench is formed with a diameter between about 0.30 to 0.60 $\mu$M, via an anisotropic RIE procedure, using fluorine based etchants for said pad silicon oxide layer, using chlorine based etchants for said SOI layer, using fluorine based etchants for said insulator layer, and using chlorine based etchants for said semiconductor substrate.

5. The method of claim 1, wherein the depth of said vertical trench, in said semiconductor substrate, is between about 1.0 to 5.0 $\mu$M.

6. The method of claim 1, wherein said lateral trench is formed by removing a portion of said insulator layer, exposed in said vertical trench, via a buffered hydrofluoric acid solution, and with said lateral trench extending between about 0.20 to 1.0 $\mu$M in said insulator layer, between overlying, said SOI layer, and underlying, said semiconductor substrate.

7. The method of claim 1, wherein said first polysilicon layer, is a P type layer, deposited via an in situ doping, LPCVD procedure, to a thickness between about 750 to 1000 Angstroms.

8. The method of claim 1, wherein said dielectric layer is a $Ta_2O_5$ layer, formed to an equivalent silicon dioxide thickness between about 40 to 150 Angstroms.

9. The method of claim 1, wherein said dielectric layer is an ONO, (Oxidized silicon Nitride on Oxide), layer, formed to an equivalent silicon dioxide thickness between about 40 to 150 Angstroms.

10. The method of claim 1, wherein said second polysilicon layer, is deposited using LPCVD procedures, to a thickness between about 1000 to 2500 Angstroms.

11. The method of claim 1, wherein said capacitor structure is formed in said vertical trench, and in said lateral trench, via an anisotropic RIE procedure using chlorine based etchants to form said cell plate structure from said second polysilicon layer, using fluorine based etchants to form said capacitor dielectric layer from said dielectric layer, and using chlorine based etchants to form said storage node structure from said first polysilicon layer.

12. The method of claim 1, wherein said transfer gate transistor is comprised of: a silicon dioxide gate insulator layer, at a thickness between about 60 to 120 Angstroms; a polysilicon gate structure, at a thickness between about 1500 to 4000 Angstroms; ion implanted, a lightly doped source and drain region, silicon oxide spacers on the sides of said polysilicon gate structure, at a thickness between about 1000 to 3000 Angstroms; and a ion implanted, heavily doped source and drain region.

13. A method for fabricating a two dimensional, trench capacitor structure, for a DRAM cell, formed on an SOI layer, on a semiconductor substrate, and using a storage node structure, of the trench capacitor structure, to connect said SOI layer, to said semiconductor substrate, comprising the steps of:

creating an insulator layer in said semiconductor substrate, underlying said SOI layer;

forming a pad silicon oxide layer on said SOI layer;

anisotropic etching to create a vertical trench in said pad silicon oxide layer, in said SOI layer, in said insulator layer, and in a top portion of said semiconductor substrate;

isotropic etching of said insulator layer, exposed in said vertical trench, to create a lateral trench;

depositing an in situ doped, first polysilicon layer, coating the sides of said vertical trench, and the coating the sides of said lateral trench, and connecting said SOI layer to said semiconductor substrate;

forming a dielectric layer on said first polysilicon layer;

depositing a second polysilicon layer on said dielectric layer, completely filling said lateral trench, and said vertical trench; and anisotropic etching of said second polysilicon layer, of said dielectric layer, and of said first polysilicon layer, to create said two dimensional, trench capacitor structure, in said vertical trench, and in said lateral trench, with said two dimensional, trench capacitor structure comprised of: a cell plate structure, formed from said second polysilicon layer; a capacitor dielectric layer, formed from said dielectric layer; and said storage node structure, formed from said first polysilicon layer; with said storage node structure connecting said SOI layer, to said semiconductor substrate.

14. The method of claim 13, wherein said insulator layer, in said semiconductor substrate, is silicon oxide, formed to a thickness between about 1500 to 3000 Angstroms, using a SIMOX process.

15. The method of claim 13, wherein said SOI layer is comprised of P type, single crystalline silicon, with a <100> crystallographic orientation, at a thickness between about 1000 to 3000 Angstroms, with a resistivity between about 10 to 50 ohm-cm.

16. The method of claim 13, wherein said vertical trench is formed via an anisotropic RIE procedure, using fluorine based etchants for said pad silicon oxide layer, and for said insulator layer, while chlorine based etchants are used for said SOI layer, and for said semiconductor substrate.

17. The method of claim 13, wherein said vertical trench has a diameter between about 0.30 to 0.60 $\mu$M.

18. The method of claim 13, wherein the depth of said vertical trench, in said semiconductor substrate, is between about 1.0 to 5.0 $\mu$M.

19. The method cf claim 13, wherein said lateral trench is formed in said insulator layer, in an area in which the sides of said insulator layer are exposed in said vertical trench, via a buffered hydrofluoric acid solution, with said lateral trench extending between about 0.20 to 1.0 $\mu$M, between said SOI layer, and said semiconductor substrate.

20. The method of claim 13, wherein said first polysilicon layer, is a P type layer, at a thickness between about 750 to 1000 Angstroms, obtained via LPCVD, using in situ doping procedures.

21. The method of claim 13, wherein said dielectric layer is a $Ta_2O_5$ layer, formed to a silicon dioxide equivalent thickness between about 40 to 150 Angstroms.

22. The method of claim 13, wherein said dielectric layer is a ONO, (Oxidized silicon Nitride on Oxide), layer, formed to a silicon dioxide equivalent thickness between about 40 to 150 Angstroms.

23. The method of claim 13, wherein said second polysilicon layer is deposited using LPCVD procedures, to a thickness between about 1000 to 2500 Angstroms.

24. The method of claim 13, wherein said two dimensional, trench capacitor structure is formed via anisotropic RIE procedures, using chlorine based etchants for said second polysilicon layer, to form said cell plate structure, using fluorine based etchants for said dielectric layer, to form capacitor dielectric layer, and using chlorine based etchants for said first polysilicon layer, to form said storage node structure.

* * * * *